United States Patent [19]
Higashiyama et al.

[11] Patent Number: 6,060,947
[45] Date of Patent: May 9, 2000

[54] HYBRID IC DEVICE WITH WIDE DYNAMIC RANGE

[75] Inventors: Katsuhiko Higashiyama, Neyagawa; Taizo Ohhama, Hirakata, both of Japan

[73] Assignee: Matsushita Electric Industrial Co., Ltd., Osaka-fu, Japan

[21] Appl. No.: 09/025,864

[22] Filed: Feb. 19, 1998

[30] Foreign Application Priority Data

Feb. 20, 1997 [JP] Japan .................................. 9-036498

[51] Int. Cl.⁷ .................................................. H01L 25/00
[52] U.S. Cl. .......................................................... 327/564
[58] Field of Search .................................. 327/333, 530, 327/534, 535, 537, 546, 563–566; 326/30, 47, 62

[56] References Cited

U.S. PATENT DOCUMENTS

| | | | |
|---|---|---|---|
| 4,933,573 | 6/1990 | Takeda et al. .......................... 327/566 |
| 5,239,215 | 8/1993 | Yamaguchi ............................. 327/564 |
| 5,306,960 | 4/1994 | Lendaro ................................. 327/564 |
| 5,512,853 | 4/1996 | Ueno et al. ............................. 327/333 |

*Primary Examiner*—My-Trang Nu Ton
*Attorney, Agent, or Firm*—Greenblum & Bernstein, P.L.C.

[57] ABSTRACT

A hybrid IC device with a wide dynamic range comprises two monolithic ICs, wherein the base electrode terminal of an npn transistor having the base potential which is the closest to the lower-limit potential in the operating range of the monolithic IC is connected to the base electrode terminal of a pnp transistor having the base potential which is the closest to the upper-limit potential in the operating range of the monolithic IC, the base electrode terminals and the substrate electrode terminals of the monolithic ICs are connected via constant voltage sources provided in the monolithic ICs, and supply electrode terminals and intake electrode terminals are, respectively, connected, thus linking the two monolithic ICs together.

8 Claims, 11 Drawing Sheets

PRIOR ART

HYBRID IC DEVICE WITH WIDE DYNAMIC RANGE

BACKGROUND OF THE INVENTION

1. Field of the Invention

This invention relates to a hybrid IC device having wide dynamic range in which wider dynamic range has been achieved through the use of a plurality of monolithic ICs.

2. Description of the Related Art

With the wider dynamic ranges being implemented in monolithic ICs in recent years, hybrid IC devices are being used in which monolithic ICs are incorporated in a variety of forms. The prior art is now discussed with reference to the drawings.

Figure 9:
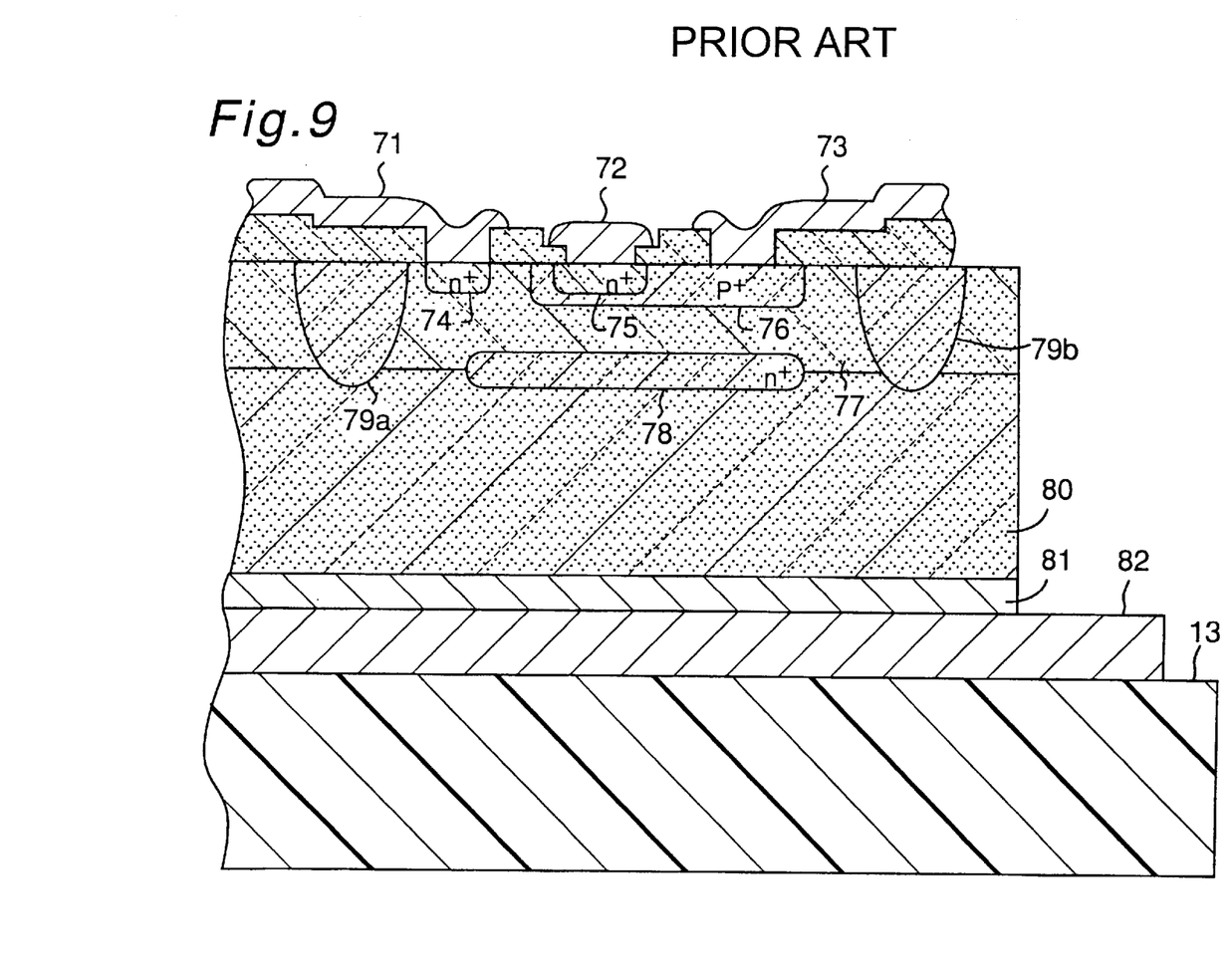
FIG. 9 is a cross-sectional view of a monolithic IC mounted on a mounting board.

The structure of a monolithic IC is first described with reference to FIG. 9, which is a cross-sectional view of an npn transistor formed inside a monolithic IC. In FIG. 9, a collector 74, emitter 75, base 76, epitaxial layer 77, imbedded layer 78, and isolation diffusion layers 79a and 79b are formed on the same p+ type substrate 80 to configure the pnp transistor. The collector 74, emitter 75, epitaxial layer 77, and imbedded layer 78 consist of n+ type silicon, while the base 76 and the isolation diffusion layers 79a and 79b consist of p+ type silicon. Also, the collector 74, emitter 75, and base 76 are provided with a collector electrode 71, emitter electrode 72, and base electrode 73, respectively, made of aluminum.

The npn transistor depicted in FIG. 9 is electrically insulated from adjacent regions by the isolation diffusion layers 79a and 79b. Such active elements (i.e. transistors or diodes) as this are formed inside monolithic ICs.

The monolithic IC is mounted on a mounting board 13, soldered through a vapor-deposited film 81 onto a substrate electrode 82 consisting of copper foil, and operated with the potential of the substrate 80 as the lowest potential.

Next will be described, with reference to FIG. 10, an example amplifier circuit that is implemented with such monolithic ICs, in a conventional IC device made up of a combination of such monolithic ICs.

Figure 10:
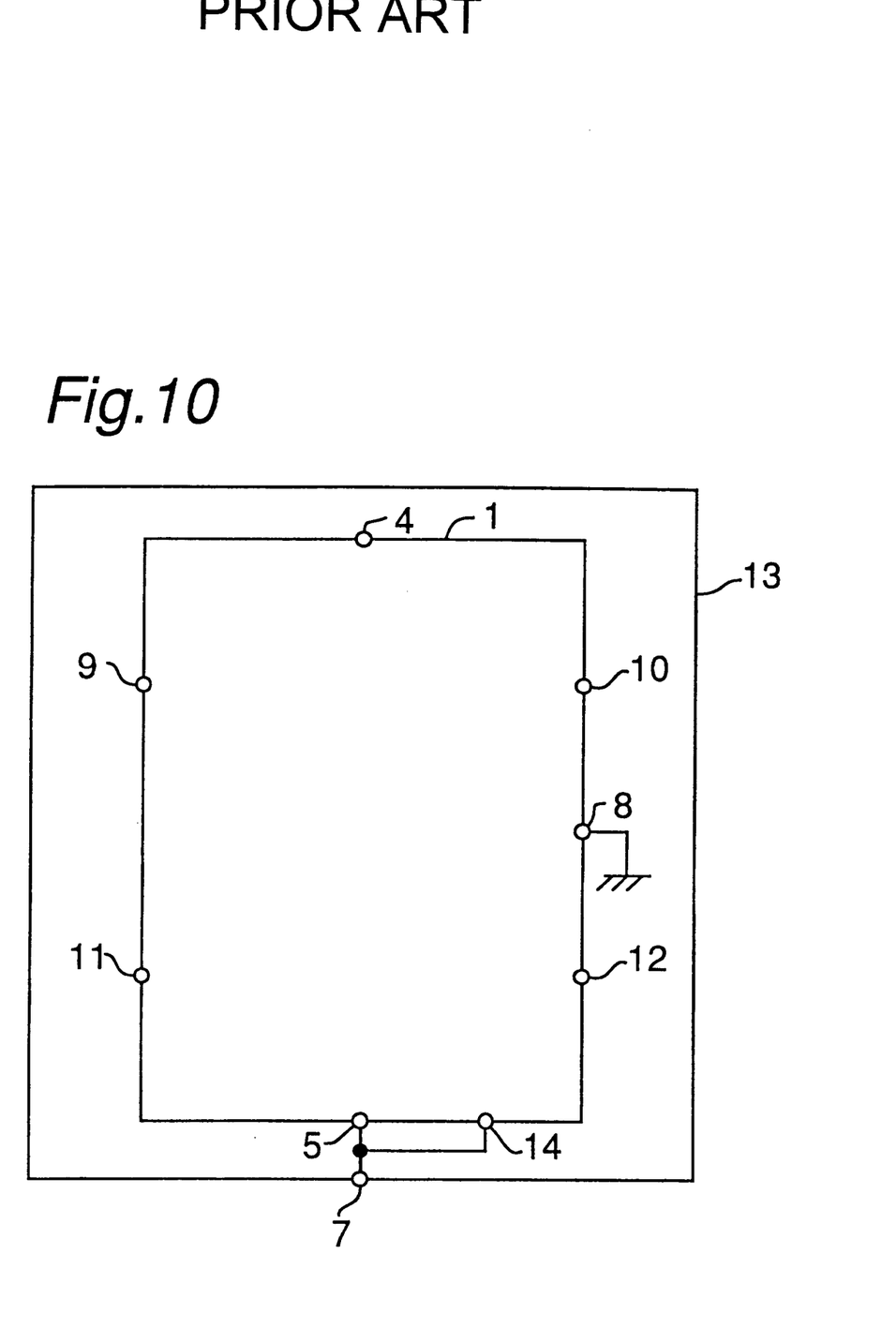
FIG. 10 is a block diagram of an amplifier circuit in a conventional hybrid IC device.

In FIG. 10, a monolithic IC 1 is mounted by soldering on a mounting board 13, as in FIG. 9. The monolithic IC 1 is an amplifier circuit that is configured with differential amplifier circuitry. It is provided with a positive highest potential electrode terminal 4, a negative highest potential electrode terminal 5, a substrate electrode terminal 14, a positive signal input terminal 9, a negative signal input terminal 11, a positive signal output terminal 10, a negative signal output terminal 12, and a ground electrode terminal 8. The ground electrode terminal 8 is connected to a ground electrode on the mounting board 13. The negative highest potential electrode terminal 5 and the substrate electrode terminal 14 are connected to a negative highest potential power supply terminal 7 on the mounting board 13, by means of which connections, all of the elements provided inside the monolithic IC operate normally without operating at a potential below that on the substrate electrode terminal.

The characteristic dynamic range of the monolithic IC 1 is determined by the characteristic dynamic ranges of each of the active elements inside it, and by the minimum value of the dynamic ranges produced between all of the active elements and the substrate electrode terminal 14. This characteristic dynamic range is the highest voltage that may be applied across the positive highest potential electrode terminal 4 and the substrate electrode terminal 14.

The monolithic IC 1 processes those signals input from the positive signal input terminal 9 that are higher than the potential on the ground electrode terminal 8, and outputs the results thereof on the positive signal output terminal 10. And it processes those signals input from the negative signal input terminal 11 that are lower than the potential on the ground electrode terminal 8, and outputs the results thereof on the negative signal output terminal 12. In other words, if the potential on the ground electrode terminal 8 is 0 V, only positive signals will be output on the positive signal output terminal 10, and only negative signals will be output on the negative signal output terminal 11.

If the characteristic dynamic range of the monolithic IC 1 is 100 V, then, ordinarily, the potential V4 on the positive highest potential electrode terminal 4 will be +50 V and the potential V14 on the substrate electrode terminal 14 will be −50 V. That is, the monolithic IC 1 is operable within a range of from V4 (=+50 V) to V14 (=−50 V).

Figure 11A:
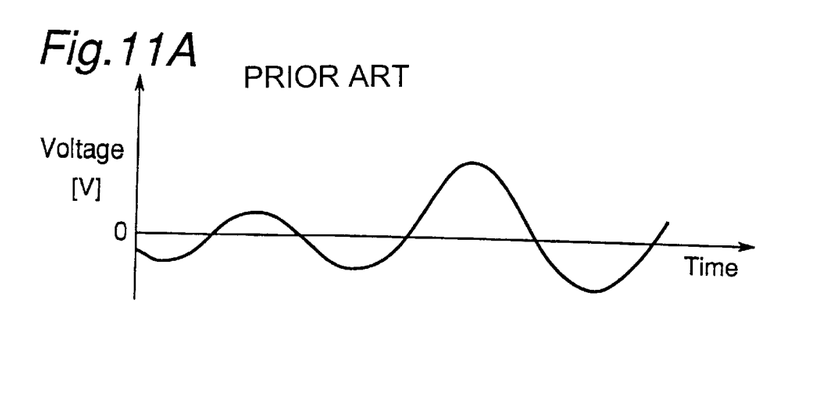
FIGS. 11A, 11B, and 11C are waveform diagrams of input/output signals of an amplifier circuit in a conventional hybrid IC device.
Figure 11B:
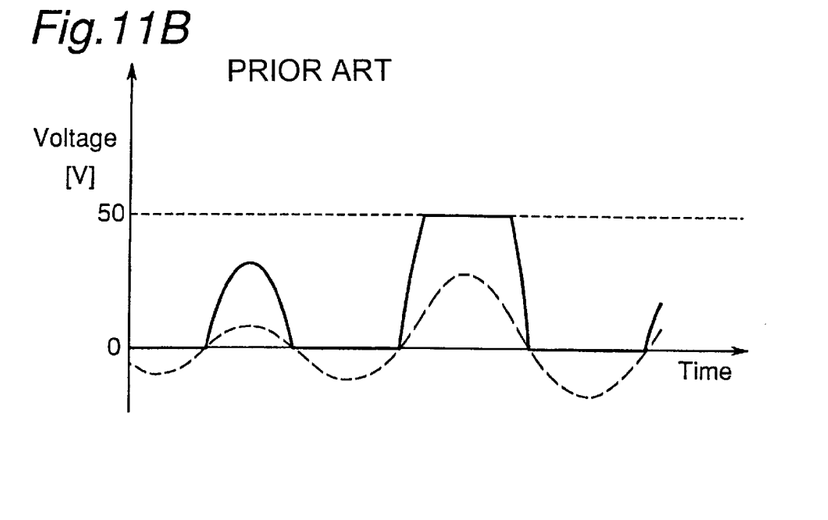
Figure 11C:
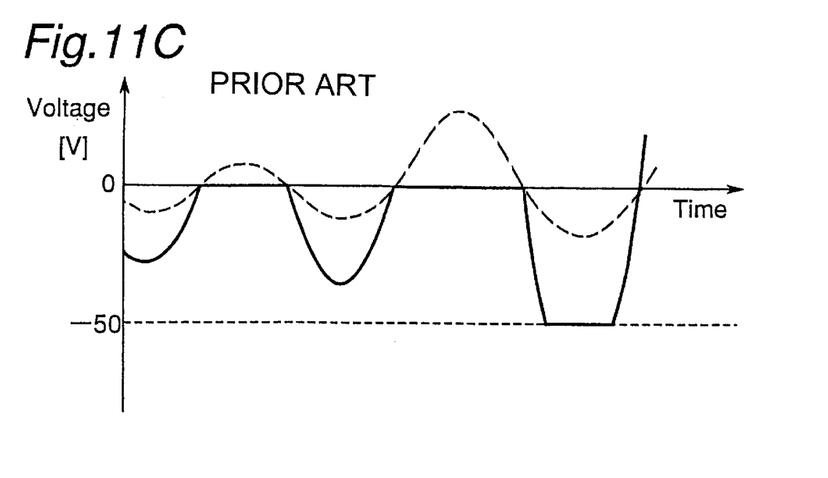

In a conventional hybrid IC device configured by combining monolithic ICs, as described above, each of the monolithic ICs operates independently. Therefore, in cases where the AC signal plotted in FIG. 11A is input on both the positive signal input terminal 9 and the negative signal input terminal 11 of the monolithic IC 1, when the absolute value of the input signal voltage exceeds a certain value, the output signal from the positive signal output terminal 10 and the output signal from the negative signal output terminal 12 will be saturated and distorted, with V4 (=+50 V) and V14 (=−50 V), as plotted in FIGS. 11B and 11C, respectively. The reason for this is that the monolithic IC 1 is unable to output an output signal the absolute value of which exceeds 50 V.

An object of the present invention is to implement, by means of innovatively connecting the monolithic ICs, a hybrid IC device exhibiting a wide dynamic range wherewith no distortion is produced in the output signals.

SUMMARY OF THE INVENTION

In order to resolve the problem noted in the foregoing, the hybrid IC device having a wide dynamic range, to which the present invention pertains, is a hybrid IC device having a wide dynamic range, configured by cascade-connecting at least two monolithic ICs, comprising: a first monolithic IC; and a second monolithic IC for which the upper-limit potential within the operating range is a potential that is higher by exactly a prescribed voltage than the potential on that one of the electrode terminals provided in the first monolithic IC which has the lowest potential; wherein: the prescribed potential is at least twice the voltage required between the base and emitter for the transistors to operate normally.

By means of the present invention, the total dynamic range becomes equivalent to roughly the sum of the characteristic dynamic ranges of the two monolithic ICs.

In a preferred embodiment of the present invention, moreover, the first monolithic IC at least comprises: a first transistor wherein the base electrode is connected to the first base electrode terminal and a current is supplied to a first supply electrode terminal; a first constant current source that is connected to a positive highest potential electrode terminal and that supplies a constant current to a second current electrode terminal; a first signal input terminal; a first signal output terminal; and a first substrate electrode terminal; and the second monolithic IC at least comprises: a second constant current source that is connected to a first intake electrode terminal and that supplies a constant current to a negative highest potential electrode terminal and to a second substrate electrode terminal; a second transistor wherein the base electrode is connected to a second base electrode terminal and which inputs current from a second intake electrode terminal having an upper-limit potential within the operating range of the second monolithic IC; a bias electrode terminal; a second signal input terminal; and a second signal output terminal; wherein: the first supply electrode terminal and the first intake electrode terminal are connected; the second supply electrode terminal and the second intake electrode terminal are connected; the first base electrode terminal and the second base electrode terminal are connected; the first substrate electrode terminal and the bias electrode terminal are connected; the potential on the bias electrode terminal is lower than the potential on the second base electrode terminal; and the voltage across the first supply electrode terminal and the second intake electrode terminal is at least twice the voltage across the base and emitter.

By means of the present invention, if the superimposed voltage of the operating ranges of the two monolithic ICs is twice or more than twice the voltage across the transistor base-emitter voltage, than the overall hybrid IC device having a wide dynamic range can operate normally.

DESCRIPTION OF THE PREFERRED EMBODIMENTS

Embodiment 1

Embodiments of the present invention are now described with reference to the drawings.

Figure 1:
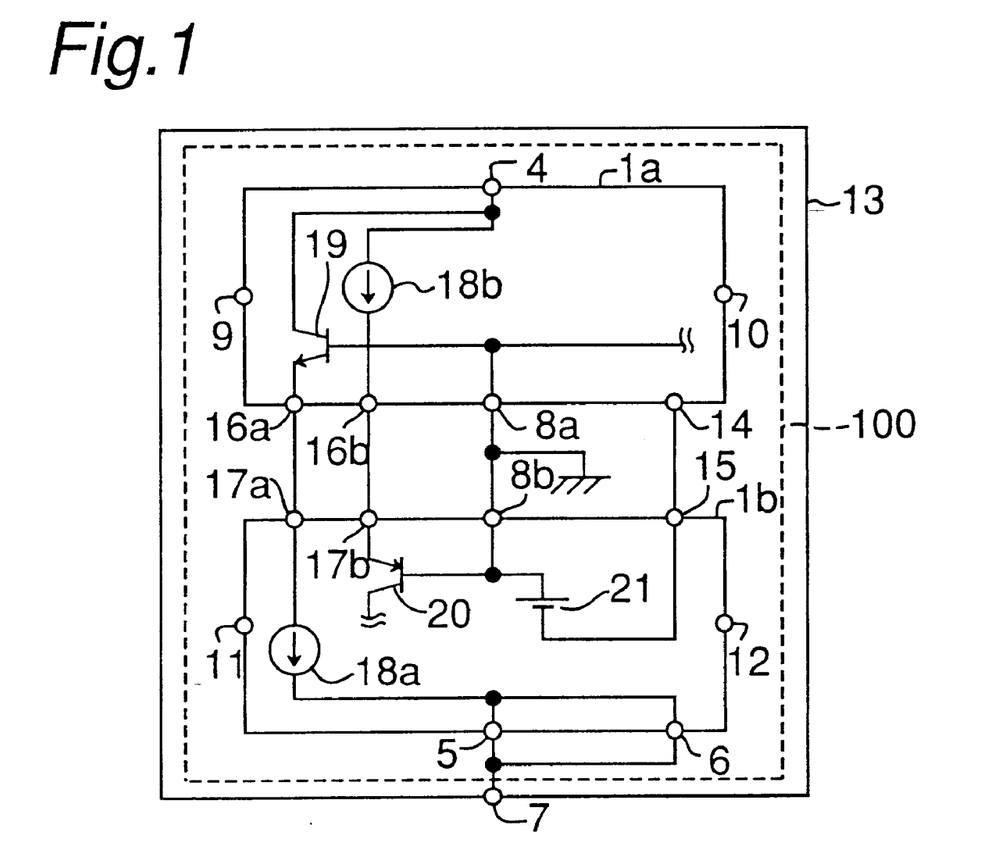
FIG. 1 is a block diagram of a hybrid IC device having a wide dynamic range, according to a first embodiment of the present invention.

FIG. 1 is a block diagram showing the main features of a hybrid IC device having a wide dynamic range, according to a first embodiment of the present invention.

The hybrid IC device with a wide dynamic range represented in FIG. 1 comprises a monolithic IC 1a and a monolithic IC 1b, each having a characteristic dynamic range. In this embodiment, both of the monolithic ICs, 1a and 1b, have the same characteristic dynamic range, and both are configured by differential amplifier circuitry.

The monolithic IC 1a is provided at least with a pnp transistor 19 and a constant current source 18b. It is assumed that the npn transistor 19 is a bipolar transistor. The emitter electrode of the npn transistor 19 is connected to a supply electrode terminal 16a, the base electrode thereof is connected both to a base electrode terminal 8a and to some other component inside the IC that is not shown in the drawing, and the collector electrode thereof is connected to a positive highest potential electrode terminal 4. The constant current source 18b supplies a constant current to a supply electrode terminal 16b, under a voltage applied to the positive highest potential electrode terminal 4 of the monolithic IC 1a. The positive highest potential electrode terminal 4 and a substrate electrode terminal 14 exhibit the upper-limit potential V4 and the lower-limit potential V14, respectively, within the range of potentials at which the monolithic IC 1a operates. The npn transistor 19, of all the transistors in the monolithic IC 1a, is the transistor exhibiting the base potential that is the closest to the substrate potential V14, which transistor here is called the lowest-potential transistor.

Hereinafter, for the sake of simplicity, the range of potentials at which the monolithic IC 1a operates, that is, the range between the upper-limit potential V4 and the lower-limit potential V14, is called the operating range of the monolithic IC 1a, and this is to be distinguished from the characteristic dynamic range that is the highest voltage which may be applied across the positive highest potential electrode terminal 4 and the substrate electrode terminal 14.

The monolithic IC 1b is provided at least with a pnp transistor 20 and a constant current source 18a. It is assumed that the pnp transistor 20 is a bipolar transistor. The emitter electrode of the pnp transistor 20 is connected to an intake electrode terminal 17b, the base electrode thereof is connected both to a base electrode terminal 8b and to the positive electrode of a constant voltage source 21, and the collector electrode thereof is connected to some other component (not shown) inside the IC. The constant voltage source 21 applies a constant voltage V21 across the base electrode terminal 8b and a bias electrode terminal 15. The constant current source 18a, under the voltage applied to an intake electrode terminal 17a, supplies a constant current to a substrate electrode terminal 6 and to a negative highest potential electrode terminal 5 in the monolithic IC 1b. The negative highest potential electrode 5 and the substrate electrode terminal 6 are connected to a negative highest potential electrode terminal 7 on a mounting board 13. The intake electrode terminal 17b exhibits the upper-limit potential V17b in the operating range of the monolithic IC 1b, while the substrate electrode terminal 6 exhibits the lower-limit potential V6. The pnp transistor 20, of all the transistors in the monolithic IC 1b, is the transistor having the base potential that is the closest to the upper-limit potential V17b in the operating range of the monolithic IC 1b, which transistor here is called the highest-potential transistor.

The two monolithic ICs 1a and 1b are interconnected by connecting the supply electrode terminal 16a and the intake electrode terminal 17a, the supply electrode terminal 16b and the intake electrode terminal 17b, the base electrode terminal 8a and the base electrode terminal 8b, and the substrate electrode terminal 14 and the bias electrode terminal 15. The base electrode terminals 8a and 8b are also connected to the ground electrode terminal, and the potential on them is 0 V.

By means of these connections, the electrical operations of the two monolithic ICs can be linked together, whereby the whole configures a hybrid IC device with a wide dynamic range 100. The positive signal input terminal 9 and positive signal output terminal 10 of the monolithic IC 1a become the positive signal input terminal and the positive signal output terminal, respectively, of the entire hybrid IC device with a wide dynamic range 100, while the negative signal input terminal 11 and negative signal output terminal 12 of the monolithic IC 1b become the negative signal input terminal and the negative signal output terminal, respectively, of the hybrid IC device with a wide dynamic range 100.

Figure 2:
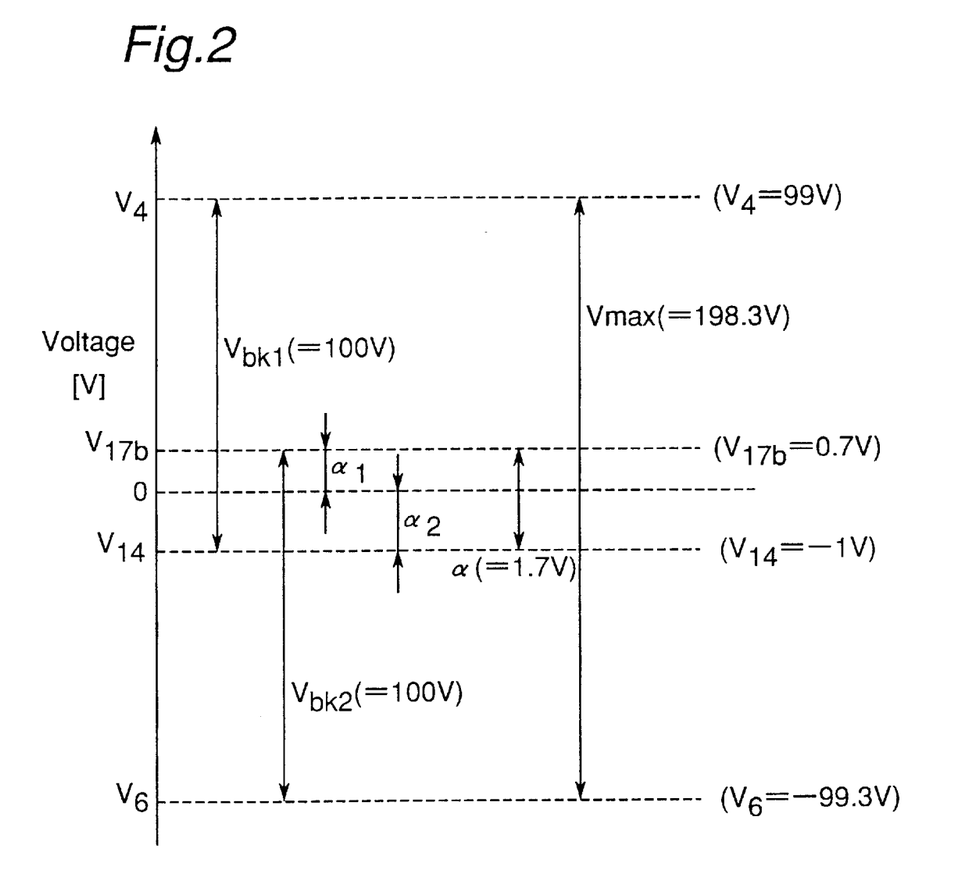
FIG. 2 is an explanatory diagram which indicates the operating ranges of each monolithic IC in the hybrid IC device having a wide dynamic range, according to the first embodiment of the present invention, together with the overall operating range thereof.
Figure 3:
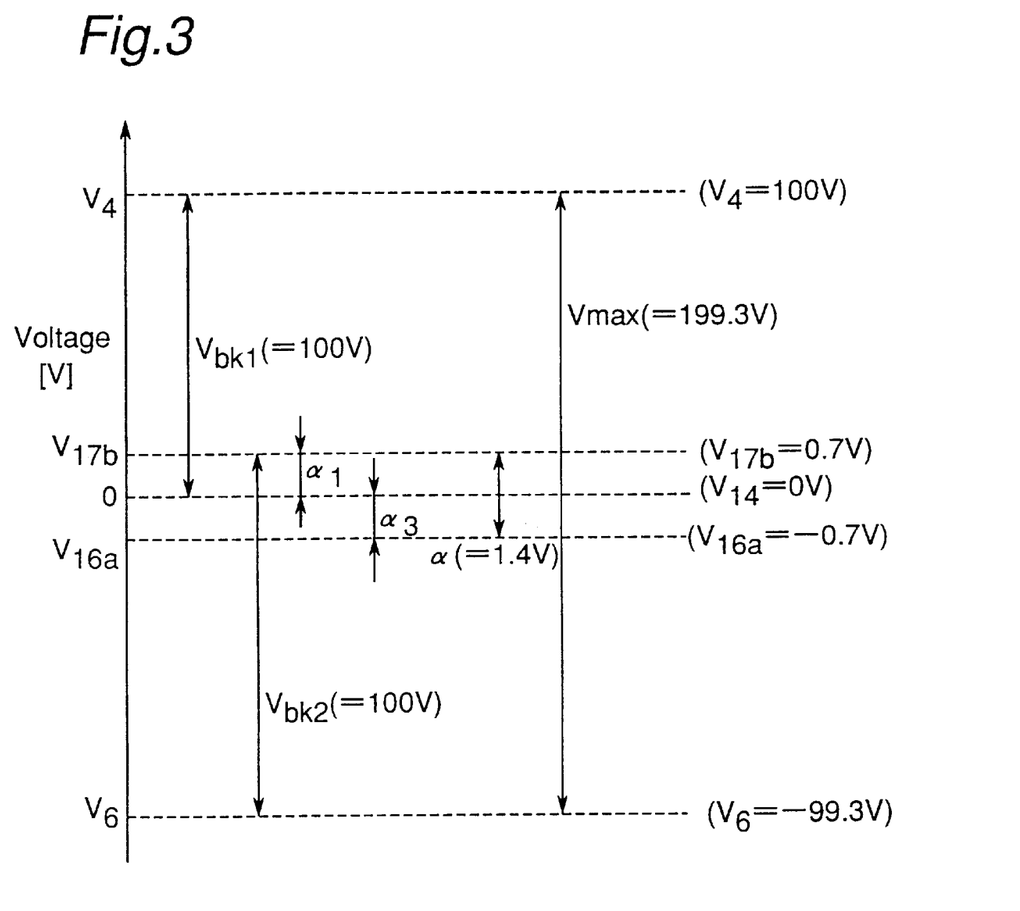
FIG. 3 is an explanatory diagram which indicates the operating ranges of each monolithic IC in the hybrid IC device having a wide dynamic range, according to the first embodiment of the present invention, together with the overall operating range thereof.

Next is described, with reference to FIGS. 2 and 3, the operating range of the hybrid IC device with a wide dynamic range 100, using specific numerical values. FIG. 2 diagrams the operating ranges for the two monolithic ICs, respectively, together with the operating range for the entire hybrid IC device with a wide dynamic range 100, when the supply voltage V21 from the constant voltage source 21 is higher than +0.7 V, which latter is the bipolar transistor base-emitter voltage $V_{BE}$.

In FIG. 2, the characteristic dynamic range of the monolithic IC 1a is the difference between the potential V4 on the positive highest potential electrode terminal 4 and the potential on the substrate electrode terminal 14, namely $V_{bk1}$, while the characteristic dynamic range of the monolithic IC 1b is the difference between the potential V17b on the intake electrode terminal 17b and the potential V6 on the substrate electrode terminal 6, namely $V_{bk2}$. In this embodiment, both of the monolithic ICs, 1a and 1b, have a characteristic dynamic range of 100 V (=$V_{bk1}$=$V_{bk2}$).

The base potential V8a in the npn transistor 19 is 0 V, for which reason it is desirable to keep the substrate potential V14 below the −0.7 V that secures the base-emitter voltage, so that the npn transistor 19, which is the lowest-potential transistor, will operate normally. To this end, the supply voltage V21 from the constant voltage source 21 provided in the monolithic IC 1b is set at a voltage higher than +0.7 V, say at +1 V, for example, and the substrate potential V14 is set at −1 V. In other words, α2 is determined by V21. That being so, the potential V4 on the positive highest potential electrode terminal 4 can be set at +99 V, so that the operating range (V4 to V14) of the monolithic IC 1a will be from +99 V to −1 V.

Meanwhile, the base potential 8b in the pnp transistor 20 that is the highest-potential transistor is 0 V, so the potential on the intake electrode terminal 17b is set higher than the +0.7 V that secures the base-emitter voltage $V_{BE}$, depending on the circuitry inside the monolithic IC 1a, so that the pnp transistor 20 will operate normally. In other words, α1 is determined by $V_{BE}$ of the pnp transistor 20. That being so, when the potential V17b on the intake electrode terminal 17b is made +0.7 V, the potential V6 on the substrate electrode terminal 6 can be set to −99.3 V, so that the operating range (V17b to V6) of the monolithic IC 1b will be from +0.7 V to −99.3 V.

Thus the operating range of the hybrid IC device with a wide dynamic range 100 will be from V4 (=+99 V) to V6 (−99.3 V), whereupon the value $V_{max}$ of the total dynamic range will be 198.3 V (=99 V +99.3 V), or approximately twice the characteristic dynamic ranges of the monolithic ICs ($V_{bk1}$=$V_{bk2}$=100 V). In FIG. 2, α is the range in which the operating ranges of the monolithic ICs 1a and 1b are superimposed, that is, the superimposed voltage. This superimposed voltage α is the potential difference between the potential V17b on the intake electrode terminal 17b and the substrate potential V14. Therefore, when the supply voltage V21=0.7 V, the minimum value thereof will be 1.4 V, and this voltage will increase as the value of the supply voltage V21 increases. In the example diagrammed in FIG. 2, the superimposed voltage α is α=α1+α2=$V_{BE}$+V21 (=1 V)=1.7 V.

The example diagrammed in FIG. 2 represents the most preferred configuration of the hybrid monolithic IC with wide dynamic range 100. However, it has been experimentally verified that a hybrid monolithic IC having wide dynamic range 100 will also operate normally in the exceptional configuration described next. This is the case where, even if the supply voltage V21 from the constant voltage source is lower than +0.7 V, the supply voltage V21 is above 0 V, and the potential V16a on the supply electrode terminal 16a is set to −0.7 V by circuitry inside the monolithic IC 1b.

In this case, the potential difference between the positive highest potential electrode terminal 4 and the supply electrode terminal 16a will exceed the characteristic dynamic range $V_{bk1}$, but the most that it can be in excess will be 0.7 V. This is a very small voltage, so the monolithic IC 1a will operate normally without any problem such as impairment to internal elements. The potential on the supply electrode terminal 16a is set to −0.7 V in order to secure the base-emitter voltage $V_{BE}$ for the npn transistor. When this is done, the electrode terminal having the lowest potential in the monolithic IC 1a will be the supply electrode terminal 16a and not the substrate electrode terminal 14.

FIG. 3 diagrams the operating ranges for two monolithic ICs in the case where the substrate potential V14 is set to 0 V, together with the operating range for the whole hybrid IC device with a wide dynamic range 100. More specifically, in this case, no constant voltage source 21 is provided, and either the base electrode terminal 8b and the bias electrode terminal 15 are connected inside the monolithic IC 1b, or the substrate electrode terminal 14 is connected directly to the ground electrode terminal. The reason for implementing such a configuration is to realize a reduction in technical and cost burdens by not having to provide the constant voltage source 21.

In FIG. 3, the substrate potential V14 is 0 V, so a voltage of 100 V can be applied to the positive highest potential electrode terminal 4. Thus the operating range (V4 to V14) of the monolithic IC 1a will become +100 V to 0 V. The operating range (V17b to V6) for the monolithic IC 1b will be the same as in the FIG. 2 example, namely +0.7 V to −99.3 V. That being so, the operating range for the hybrid IC device with a wide dynamic range 100 will be from V4 (=+100 V) to V6 (=−99.3 V), and the total dynamic range value $V_{max}$ will be 199.3 V (=100 V +99.3 V), or approximately twice the characteristic dynamic ranges ($V_{bk1}$=$V_{bk2}$= 100 V) of the monolithic ICs.

In FIG. 3, furthermore, α3 represents the voltage between the potential V16a on the supply electrode terminal 16a and the ground electrode terminal. The superimposed voltage α represents the potential difference between the potential V17b on the intake electrode terminal 17b and the potential V16b on the supply electrode terminal 16a. Also, when the supply voltage V21 is greater than 0 V but lower than 0.7 V, of the electrode terminals provided in the monolithic IC 1a, the supply electrode terminal 16a will have the lowest potential, so the situation will always be α+α1+α3=$V_{BE}$+$V_{BE}$=1.4 V.

Figure 4A:
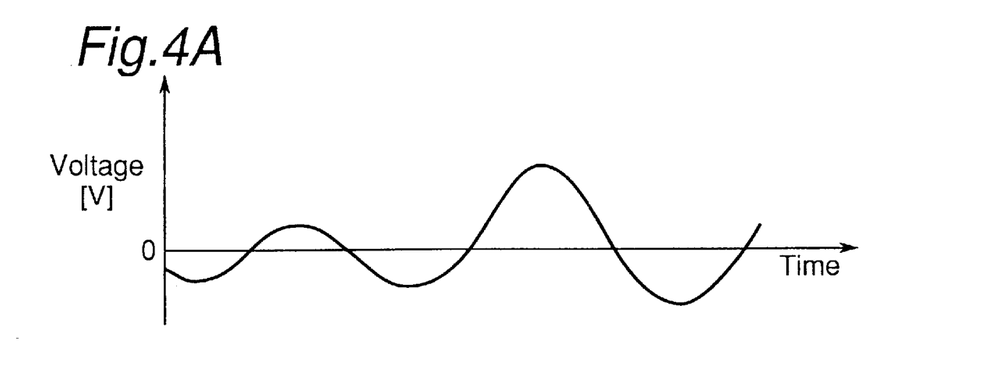
FIGS. 4A, 4B, and 4C are waveform diagrams of input/output signals in the hybrid IC device having a wide dynamic range, according to the first embodiment of the present invention.
Figure 4B:
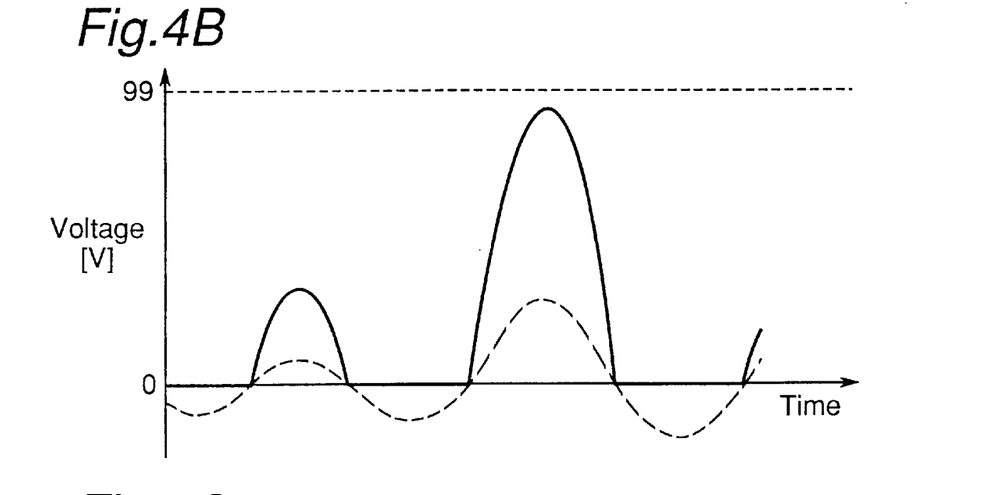
Figure 4C:
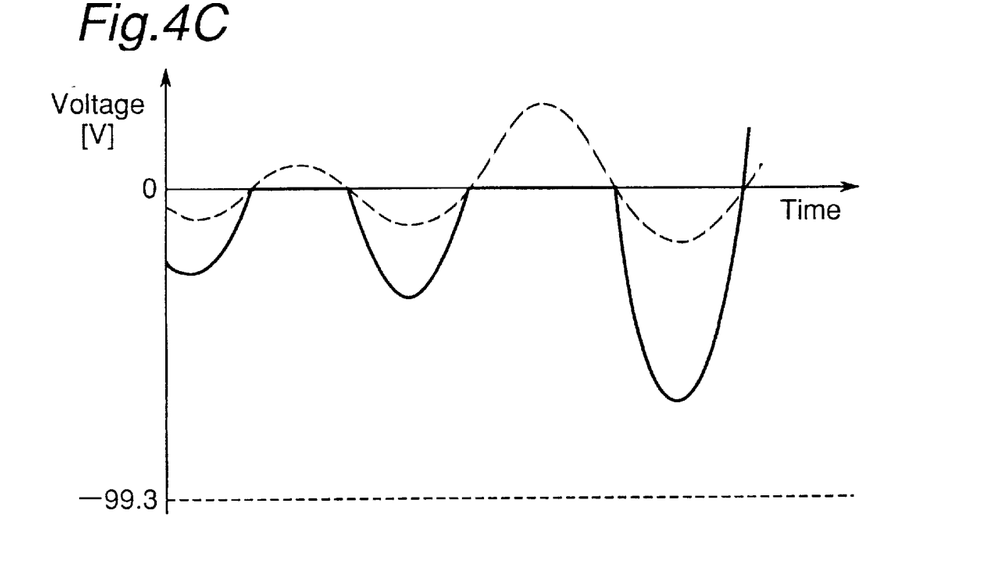

The operation of this hybrid IC device with a wide dynamic range 100 will now be described. It is first of all assumed that the input signal diagrammed in FIG. 4A is input on both the positive signal input terminal 9 and the negative signal input terminal 11 of the hybrid IC device with a wide dynamic range 100. In the monolithic IC 1a, roughly the positive half of the input signal will be amplified within the operating range between V14 and V4, while in the monolithic IC 1b, roughly the negative half of the input signal will be amplified within the operating range between V17b and V6. Accordingly, in terms of the overall hybrid IC device with a wide dynamic range 100, amplification will be performed in the operating range between V4 and V6, and the output signals from the positive output signal terminal 10 and the negative output signal terminal 12 will have the normal waveforms diagrammed in FIGS. 4B and 4C, respectively, without saturation or distortion.

Figure 5:
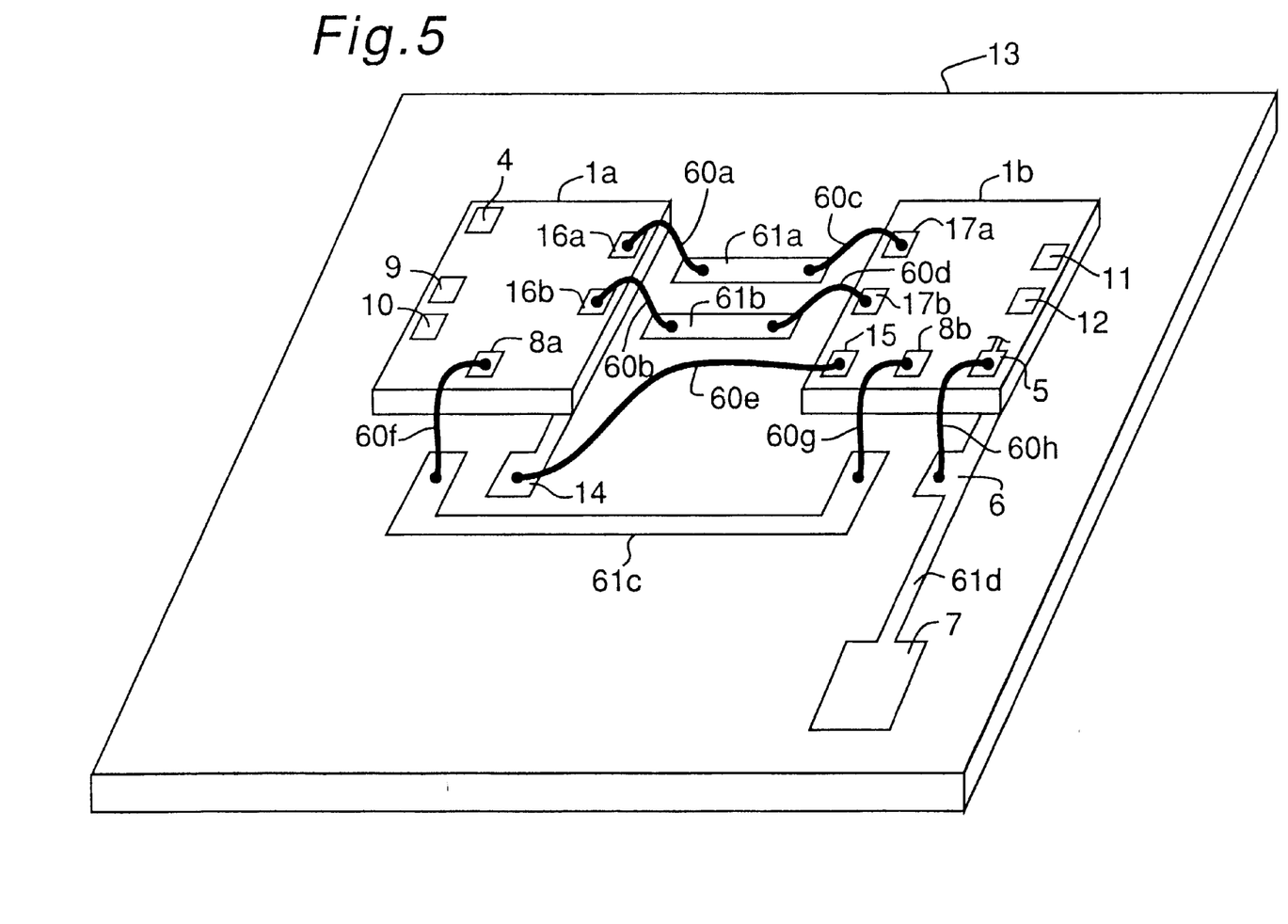
FIG. 5 is a diagonal view depicting the main features of the hybrid IC device having a wide dynamic range, according to the first embodiment of the present invention.

FIG. 5 is a diagonal view depicting the general appearance of the hybrid IC device with a wide dynamic range in the first embodiment of the present invention. As is diagrammed in FIG. 5, the supply electrode terminal 16a and the intake electrode terminal 17a are connected by bonding wires 60a and 60c across a copper foil 61a on the mounting board, while the supply electrode terminal 16b and the intake electrode terminal 17b are connected by bonding wires 60b and 60d across a copper foil 61b on the mounting board.

The substrate electrode terminal 14 is connected to the bias electrode terminal 15 by a bonding wire 60e, while the base electrode terminals 8a and 8b are connected by bonding wires 60f and 60g, respectively, through a copper foil 61c on the mounting board. The copper foil 61c is the ground electrode terminal. The substrate electrode terminal 6 and the negative highest potential electrode terminal 7, meanwhile, are parts of a copper foil 61d on the mounting board, and are connected to the negative highest potential electrode terminal 5 by a bonding wire 60h.

When this embodiment, as described in the foregoing, is used, it is possible to provide a hybrid IC device with a wide dynamic range that is configured by cascade-connecting two monolithic ICs (monolithic ICs 1a and 1b), comprising a first monolithic IC (monolithic IC 1a), and a second monolithic IC (monolithic IC 1b) having an upper-limit potential V17b in the operating range thereof that is higher by exactly a prescribed voltage α than the potential (V14 or V16a) on that electrode terminal provided in the first monolithic IC which has the lowest potential, wherein the prescribed potential α is twice (=1.4 V) $V_{BE}$ or more, so that the total dynamic range $V_{max}$ becomes approximately twice the characteristic dynamic ranges ($V_{bk1}$, $V_{bk2}$) of the individual monolithic ICs.

In this embodiment, moreover, a configuration has been described wherein two supply electrode terminals and two intake electrode terminals, respectively, are connected, but the number of such connections may be changed, depending on the amplifier circuitry provided in the monolithic ICs. Therefore the present invention is not limited to the embodiment described in the foregoing.

Embodiment 2

Figure 6:
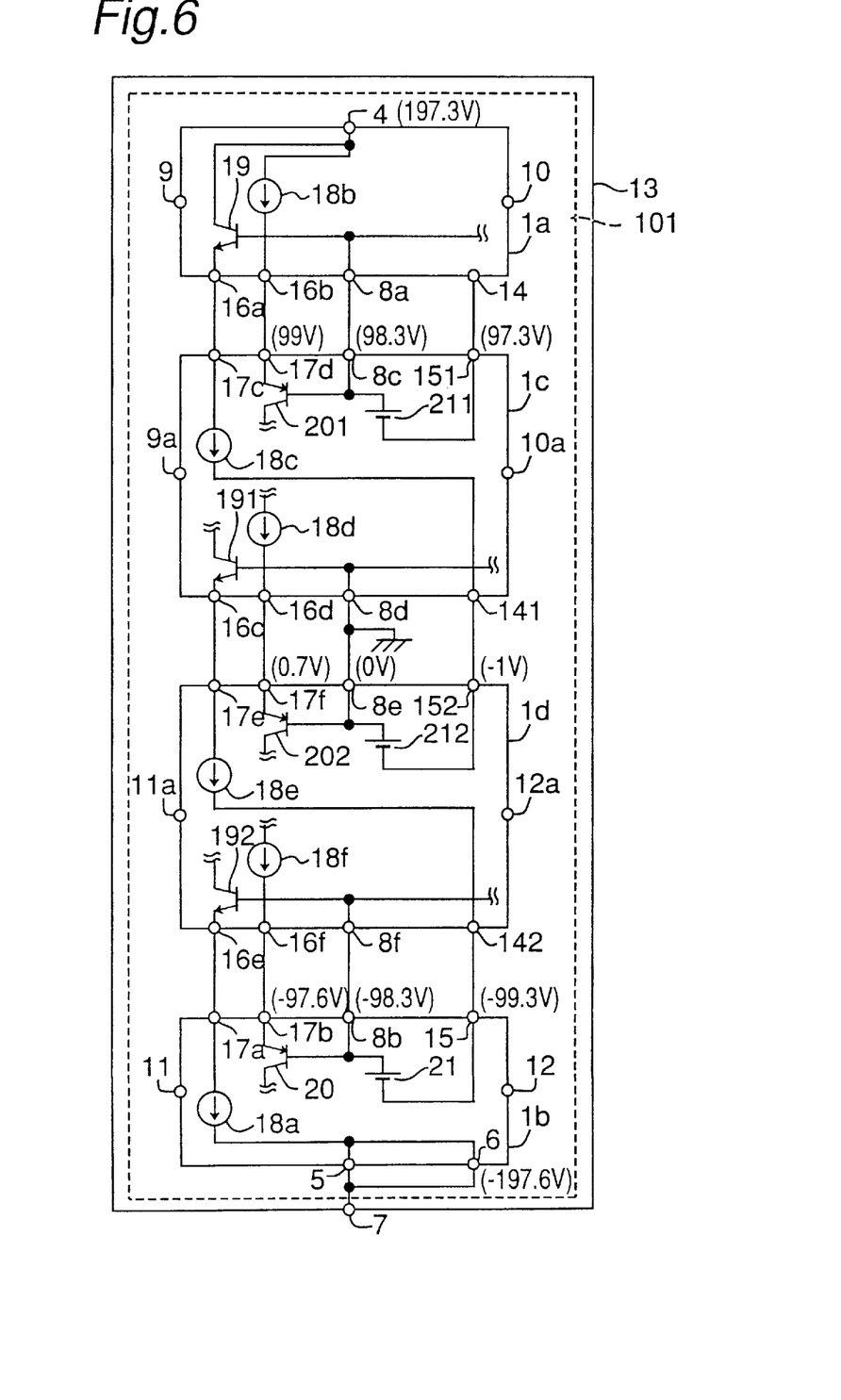
FIG. 6 is a block diagram of a hybrid IC device having a wide dynamic range, according to a second embodiment of the present invention.

A second embodiment of the present invention will now be described, with reference to FIG. 6. FIG. 6 is a block diagram of the hybrid IC device with a wide dynamic range in the second embodiment of the present invention. Components having the same function as in FIG. 1 are identified by the same reference characters and not further described.

FIG. 6 diagrams the overall configuration of a hybrid IC device with a wide dynamic range 101 that is formed by connecting four monolithic ICs together using the same connection techniques as for the first embodiment. The additional monolithic ICs connected, namely 1c and 1d, are also amplifier circuits having a characteristic dynamic range of 100 V, made up of differential amplifier circuitry. More specifically, the characteristic dynamic range of monolithic IC 1c is $V_{bk3}$, and that of monolithic IC 1d is $V_{bk4}$, such that $V_{bk3}$=$V_{bk4}$=100 V.

The monolithic IC 1c at least comprises an npn transistor 191, a pnp transistor 201, a constant current source 18d, a constant current source 18c, and a constant voltage source 211. It is assumed that both the npn transistor 191 and the pnp transistor 201 are bipolar transistors. The emitter electrode of the npn transistor 191 is connected to a supply electrode terminal 16c, the base electrode thereof is connected both to a base electrode terminal 8d and to another component in the IC not shown in the diagram, and the collector electrode thereof is connected to another component (not shown) in the IC. The constant current source 18d supplies a constant current to a current electrode terminal 16d under a supply voltage from another component (not shown) in the IC.

The emitter electrode of the pnp transistor 201 is connected to a supply electrode terminal 17d, the base electrode thereof is connected both to a base electrode terminal 8c and to another component (not shown) in the IC, and the collector electrode thereof is connected to another component (not shown) in the IC. The constant voltage source 211 applies a constant voltage V211 across the base electrode terminal 8c and a bias electrode terminal 151. The constant current source 18c supplies a constant current to the substrate electrode terminal 141 of the monolithic IC 1c under the voltage applied to an intake electrode terminal 17c. An intake electrode terminal 17d has the upper-limit potential V17d in the operating range of the monolithic IC 1c, while the substrate electrode terminal 141 has the lower-limit potential V141 in the operating range of the monolithic IC 1c.

The monolithic IC 1d is provided at the least with an npn transistor 192, a pnp transistor 202, a constant current source 8f, a constant current source 18e, and a constant voltage source 18e. It is assumed that the npn transistor 192 and pnp transistor 202 are both bipolar devices. The emitter electrode of the npn transistor 192 is connected to a supply electrode terminal 16e, the base electrode thereof is connected both to a base electrode terminal 85 and to another component (not shown) in the IC, and the collector electrode thereof is connected to another component (not shown) in the IC. The constant current source 18f supplies a constant current to a supply electrode terminal 16f under a supply voltage from another component (not shown) in the IC.

The emitter electrode of the pnp transistor 202 is connected to a intake electrode terminal 17f, the base electrode thereof is connected both to a base electrode terminal 8e and to the positive electrode of a constant voltage source 212, and the collector electrode thereof is connected to another component (not shown) in the IC. The constant voltage source 212 applies a constant voltage V212 across the base electrode terminal 83 and a bias electrode terminal 152. The constant current source 18e supplies a constant current to a substrate electrode terminal 142 of the monolithic IC 1d under a voltage applied to an intake electrode terminal 17e. An intake electrode terminal 17f has the upper-limit potential V17f in the operating range of the monolithic IC 1d, while the substrate electrode terminal 142 has the lower-limit potential V142 in the operating range of the monolithic IC 1d.

The monolithic ICs 1c and 1d are connected together by connecting the supply electrode terminal 16c to the intake electrode terminal 17e, the supply electrode terminal 16d to the intake electrode terminal 17f, and the substrate electrode terminal 141 to the bias electrode terminal 152. Also, the base electrode terminal 8d and the base electrode terminal 8e are connected to a ground electrode terminal.

The monolithic IC 1c is connected to the monolithic IC 1a by connecting the terminals of the monolithic IC 1c (namely the intake electrode terminal 17c, intake electrode terminal 17d, base electrode terminal 8c, and bias electrode terminal 151) to the terminals of the monolithic IC 1a (namely the supply electrode terminal 16a, supply electrode terminal 16b, base electrode terminal 8a, and substrate electrode terminal 14), respectively, as diagrammed in FIG. 6. Likewise, the monolithic IC 1d is connected to the monolithic IC 1b by connecting the terminals of the monolithic IC 1d (namely the supply electrode terminal 16e, supply electrode terminal 16f, base electrode terminal 8f, and substrate electrode terminal 142) to the terminals of the monolithic IC 1b (namely the intake electrode terminal 17a, intake electrode terminal 17b, base electrode terminal 8b, and bias electrode terminal 15), respectively, as diagrammed in FIG. 6. In this manner the four monolithic ICs are interconnected. It should be noticed, however, that, in the second embodiment, the base electrode terminals 8a and 8b are not connected to a ground electrode terminal.

The monolithic IC 1c is also provided with a positive signal input terminal 9a and a positive signal output terminal 10a, while the monolithic IC 1d is provided with a negative signal input terminal 11a and a negative signal output terminal 12a.

Now, if the supply voltage V211 of the constant voltage source 211 and the supply voltage V212 of the constant voltage source 212 are made +1 V, the potential V152 on the bias electrode terminal 152 of the monolithic IC 1d, that is, the potential V141 on the substrate electrode terminal 141, will be −1 V due to the base electrode terminal 8e and the constant voltage source 212, making it possible to set the potential V17d on the intake electrode terminal 17d to 99 V. When V17d has been set to 99 V, the potential V151 on the bias electrode terminal 151, that is, the potential V14 on the substrate electrode terminal 14, will be 97.3 V due to $V_{BE}$ on the pnp transistor 201 and the applied voltage V211 of the constant voltage source 211. Accordingly, a voltage of 197.3 V can be applied to the positive highest potential electrode terminal 4.

In other words, the operating range (V17d to V141) of the monolithic IC 1c will be from +99 V to −1 V, and the operating range (V4 to V14) of the monolithic IC 1a will be from +197.3 V to +97.3 V.

The potential V17f on the intake electrode terminal 17f will be 0.7 V based on the $V_{BE}$ on the pnp transistor 202, so a voltage of −99.3 V can be applied to the substrate electrode terminal 142. When the potential V142 on the substrate electrode terminal 142 is made −99.3 V, the potential V17b on the intake electrode terminal 17b will become −97.3 V due to the $V_{BE}$ of the pnp transistor 20 and the applied voltage V21 of the constant voltage source 21. Accordingly, a voltage of −197.6 V can be applied to the negative highest potential electrode terminal 7.

In other words, the operating range (V17f to V142) of the monolithic IC 1d will be from +0.7 V to −99.3 V, and the operating range (V17b to V6) of the monolithic IC 1b will be from −97.6 V to −197.6 V.

As described in the foregoing, the operating range of the hybrid IC device with a wide dynamic range 101 will be from V4 (=+197.3 V) to V6 (=−197.6 V), so that the total dynamic range value $V_{max}$ becomes 394.9 V (=197.6 V+197.6 V), or approximately four times the characteristic dynamic ranges of the individual monolithic ICs (i.e. $V_{bk1}=V_{bk2}=V_{bk3}=V_{bk4}=100$ V). Then, moreover, the superimposed voltage α in the operating ranges of two adjacent monolithic ICs will be 1.7 V, respectively.

Each of the monolithic ICs, however, only operates within its own operating range, so each one handles one quarter of the overall operating range, operating while being linked together. For this reason, the positive signal input terminal 9a and positive signal output terminal 10a are provided in the monolithic IC 1c, and the negative signal input terminal 11a and negative signal output terminal 12a are provided in the monolithic IC 1d.

When this embodiment, as described in the foregoing, is used, it is possible to provide a hybrid IC device with a wide dynamic range that is configured by cascade-connecting four monolithic ICs (monolithic ICs 1a, 1b, 1c, and 1d), which, as concerning two adjacent monolithic ICs (monolithic ICs 1c and 1d, for example), comprises a first monolithic IC (monolithic IC 1c), and a second monolithic IC (monolithic IC 1d) having an upper-limit potential V17f (=+0.7 V) in the operating range thereof that is higher by exactly a prescribed voltage α (=1.7 V) than the lower-limit potential V141 (=−1 V) in the operating range of the first monolithic IC, wherein the prescribed potential α is higher than $V_{BE}$, so that the total dynamic range $V_{max}$ becomes approximately four times the characteristic dynamic ranges of the individual monolithic ICs (i.e. 394.9 V).

The description given for this embodiment assumes that the number of monolithic ICs linked together is 4, but there is no limit on the number of linked monolithic ICs so long as the same interconnection method is employed. In other words, one need only connect monolithic ICs having the same structure as 1c and 1d between the monolithic ICs 1a and 1b.

Accordingly, when N monolithic ICs are linked together in this manner (N being an even number), the total dynamic range $V_{max}$ can be made approximately N times the characteristic dynamic ranges of the individual monolithic ICs.

The description given for this embodiment, moreover, assumes that all of the monolithic ICs have the same characteristic dynamic range, but the same configuration can be implemented even when the characteristic dynamic ranges of the four monolithic ICs differ. Hence the present invention is not limited to the embodiment described in the foregoing.

Embodiment 3

Figure 7:
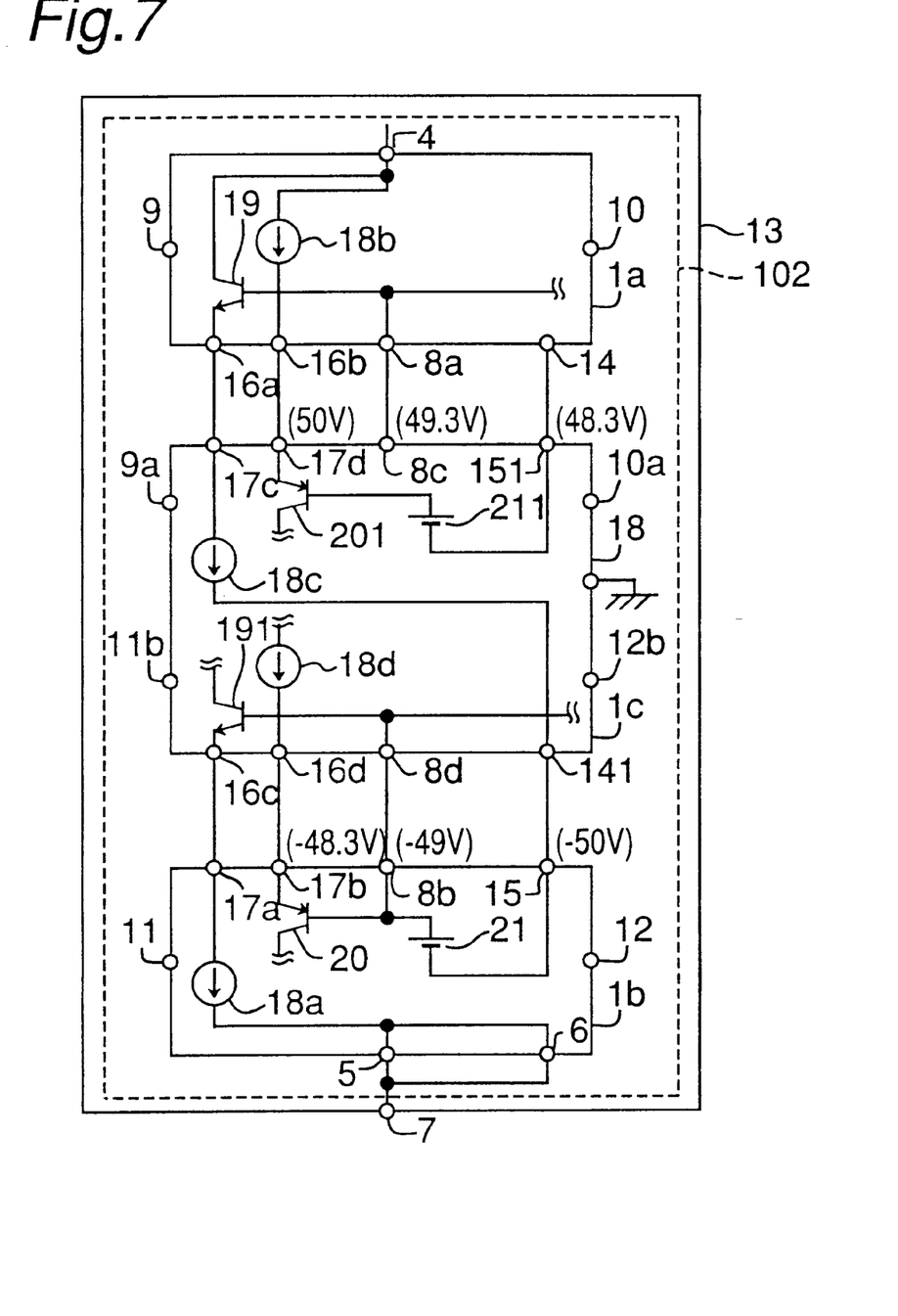
FIG. 7 is a block diagram of a hybrid IC device having a wide dynamic range, according to a third embodiment of the present invention.

A third embodiment will now be described making reference to FIG. 7. FIG. 7 is a block diagram of the hybrid IC device with a wide dynamic range in the third embodiment of the present invention. In FIG. 7, components having the same functions as in FIGS. 1 and 6 are identified by the same reference characters and are not further described.

As diagrammed in FIG. 7, a single overall hybrid IC device with a wide dynamic range 102 is configured by linking together three monolithic ICs (monolithic ICs 1a, 1b, and 1c) by the same interconnection method as used in the first and second embodiments.

In this case, the monolithic IC 1b is linked together with the monolithic IC 1c by connecting the terminals of the monolithic IC 1b (namely the intake electrode terminal 17a, intake electrode terminal 17b, base electrode terminal 8b, and bias electrode terminal 15) to the terminals of the monolithic IC 1c (namely the supply electrode terminal 16c, supply electrode terminal 16d, base electrode terminal 8d, and substrate electrode terminal 141), respectively. Also, the ground electrode terminal 8 is connected to a ground electrode terminal on the mounting board 13 so that the potential right in the middle of the operating range (V17d to V141) of the monolithic IC 1c is 0 V. The monolithic IC 1c also is provided with a negative signal input terminal 11b and a negative signal output terminal 12b. These are the points of difference with the second embodiment.

In the monolithic IC 1c, the potential V141 on the substrate electrode terminal 141 is −50 V, and the operating range thereof is from +50 V to −50 V. In this instance, the potential V17b on the intake electrode terminal 17b becomes −48.3 V due to the $V_{BE}$ of the pnp transistor 20 and the supply voltage V21 from the constant voltage source 21. Accordingly, a voltage of −148.3 V can be applied to the negative highest potential electrode terminal 7.

On the other hand, because the potential V17d on the intake electrode terminal 17d is +50 V, the potential V14 on the substrate electrode terminal 14 will be +48.3 V due to the $V_{BE}$ of the pnp transistor and the supply voltage V211 from the constant voltage source 211. Accordingly, a voltage of 148.3 V can be applied to the positive highest potential electrode terminal 4.

As described in the foregoing, the dynamic range of the hybrid IC device with a wide dynamic range 102 will be from V4 (=+148.3 V) to V6 (=−148.3 V), and the total dynamic range $V_{max}$ will be 296.6 V (=148.3 V+148.3 V), or approximately three times the characteristic dynamic ranges of the individual monolithic ICs ($V_{bk1}=V_{bk2}=V_{bk3}=$ 100 V). In this case, the superimposed voltage α in the operating range of the two adjacent monolithic ICs, respectively, is 1.7 V.

Each monolithic IC will operate within its own operating range, however, so each one will handle one third of the total operating range, operating while linked together. That is why the monolithic IC 1c is provided with a negative signal input terminal 11b and a negative signal output terminal 12b.

When this embodiment, as described in the foregoing, is used, it is possible to provide a hybrid IC device with a wide dynamic range that is configured by cascade-connecting three monolithic ICs (monolithic ICs 1a, 1b, and 1c), which, as concerning two adjacent monolithic ICs (monolithic ICs 1a and 1c, for example), comprises a first monolithic IC (monolithic IC 1a), and a second monolithic IC (monolithic IC 1c) having an upper-limit potential V17d (=50 V) in the operating range thereof that is higher by exactly a prescribed voltage α (=1.7 V) than the lower-limit potential V14 (=48.3 V) in the operating range of the first monolithic IC, wherein the prescribed potential α is higher than $V_{BE}$, so that the total dynamic range $V_{max}$ becomes approximately three times the characteristic dynamic ranges of the individual monolithic ICs (i.e. 296.6 V).

The description given for this embodiment assumes that the number of monolithic ICs linked together is 3, but there is no limit on the number of linked monolithic ICs so long as the same interconnection method is employed. In other words, one need only connect monolithic ICs having the same structure as 1d, described for the first embodiment, between the monolithic ICs 1a and 1c, and between the monolithic ICs 1b and 1c. Accordingly, when M monolithic ICs are linked together in this manner (M being an odd number), the total dynamic range $V_{max}$ can be made approximately M times the characteristic dynamic ranges of the individual monolithic ICs.

The description given for this embodiment, moreover, assumes that all of the monolithic ICs have the same characteristic dynamic range, but the same configuration can be implemented even when the characteristic dynamic ranges of the three monolithic ICs differ. Hence the present invention is not limited to the embodiment described in the foregoing.

Embodiment 4

Figure 8:
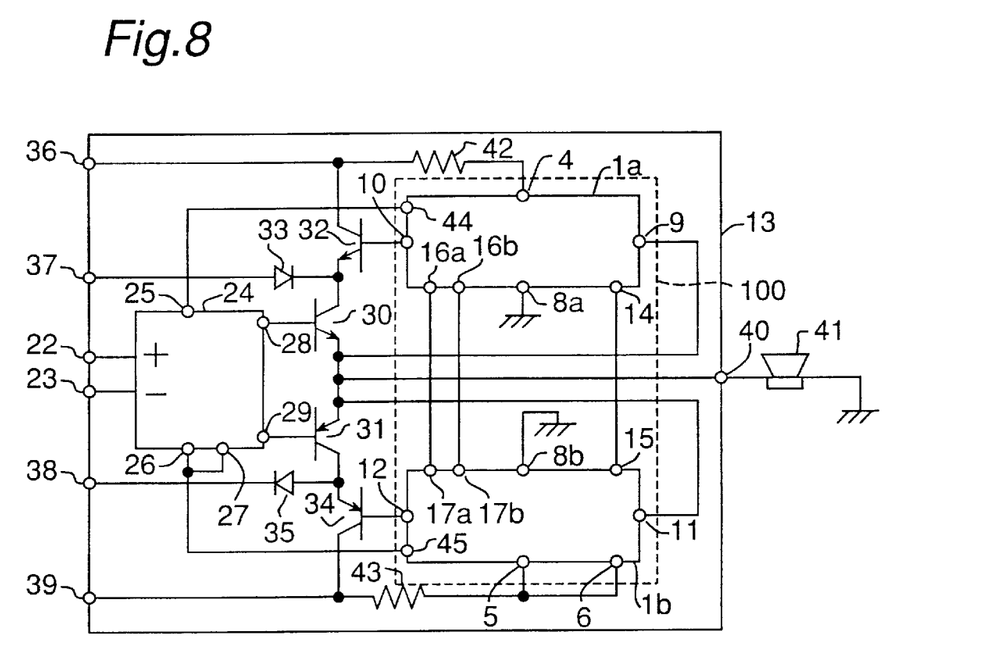
FIG. 8 is a block diagram of a hybrid IC device having a wide dynamic range, according to a fourth embodiment of the present invention.

A fourth embodiment is now described, making reference to FIG. 8. FIG. 8 is a block diagram of the hybrid IC device with a wide dynamic range in the fourth embodiment of the present invention. FIG. 8 diagrams the configuration of a dual-power-supply-supply switching amplifier circuit that employs the hybrid IC device with a wide dynamic range 100 described for the first embodiment. In FIG. 8, components having the same function as in FIG. 1 are identified by the same reference characters and not further described.

To begin with, a voltage VH+ of +100 V is supplied from the outside to a positive highest potential electrode terminal 36, and a voltage VH− of −100 V is supplied from the outside to a negative highest potential electrode terminal 39. To a positive lowest potential electrode terminal 37 is supplied a voltage VL+ (+30 V, for example) that has a smaller absolute value than VH+, while to a negative lowest potential electrode terminal 38 is supplied a voltage VL− (−30 V, for example) that has a smaller absolute value than VH−. The supply voltages VL+ and VL− are supplied, respectively, to the p terminal of a power-switching diode 33 and the n electrode of a power-switching diode 35.

A voltage of +99 V is supplied from the positive highest potential electrode terminal 36 through a resistor 42 to the positive highest potential electrode terminal 4 of the hybrid IC device with a wide dynamic range 100, and a voltage of −99.3 V is supplied from the negative highest potential electrode terminal 39 through a resistor 43 to both the substrate electrode terminal 6 and the negative highest potential electrode terminal 5 of the hybrid IC device with a wide dynamic range 100.

A signal amplifier 24 is an amplifier circuit with a 100V dynamic range. A voltage of +50 V is supplied to the positive highest potential electrode terminal 25 and a voltage of −50 V is supplied to the negative highest potential electrode terminal 26 and to a substrate electrode terminal 27. The voltage of +50 V is supplied from circuitry provided inside the monolithic IC 1a via a positive generated voltage supply terminal 44, while the voltage −50 V is supplied from circuitry provided inside the monolithic IC 1b via a negative generated voltage supply terminal 45. A positive signal input terminal 22 and a negative signal input terminal 23 are, respectively, the positive and negative signal input terminals for the signal amplifier 24, while a positive signal output terminal 28 and a negative signal output terminal 29 are, respectively, the positive and negative signal output terminals for the signal amplifier 24.

In the circuit diagrammed in FIG. 8, four power transistors are used. The collector electrode of an npn power transistor 32 is connected to the positive highest potential electrode terminal 36, the base electrode thereof is connected to the positive signal output terminal 10, and the emitter terminal thereof is connected to the n terminal of the power-switching diode 33. The collector electrode of an npn power transistor 30 is connected to the n electrode of the power-switching diode 33, the base electrode thereof is connected to the positive signal output terminal 28, and the emitter electrode thereof is connected to the emitter electrode of a pnp power transistor 31.

The emitter electrode of the pnp power transistor 31 is connected to the emitter electrode of the npn power electrode terminal 30, the base electrode thereof is connected to the negative signal output terminal 29, and the collector electrode thereof is connected to the p terminal of the power-switching diode 35. The emitter electrode of a pnp power transistor 34 is connected to the p electrode of the power-switching diode 35, the base electrode thereof is connected to the negative signal output terminal 12, and the collector electrode thereof is connected to the negative highest potential electrode terminal 39.

On the mounting board 13 is provided a signal output terminal 40 which is the signal output terminal for the whole circuit in FIG. 8. This signal output terminal 40 is connected both to the connector between the emitter electrode of the npn power transistor 30 and the emitter electrode of the pnp power transistor 31, and to the two signal input terminals of the hybrid IC device with a wide dynamic range 100 (that is, to the positive signal input terminal 9 and the negative signal input terminal 11). A speaker 41 is also connected to the signal output terminal 40.

The operation of the dual-power-supply switching amplifier circuit configured as described above is now explained. The signal amplifier 24 amplifies input signals that are input through a non-reversing input terminal 22 and a reversing input terminal 23, and outputs the output signals, respectively, on a first signal output terminal 28 and a second signal output terminal 29. In normal cases, that is, when the absolute values of the voltages of the input signals from the non-reversing input terminal 22 and the reversing input terminal 23 are below a certain level, the npn power transistor 30 is controlled by the output signal from the first signal output terminal 28, and operates with power from the supply voltage VL+. The pnp power transistor 31, meanwhile, is controlled by the output signal from the second signal output terminal 29, and operates with power from the supply voltage VL−.

As described in the foregoing, the output signals obtained as a result of the operations of the npn power transistor 30 and pnp power transistor 31 are supplied to the speaker 41 from the signal output terminal 40.

However, when the absolute value of the voltage of the input signal rises above a certain level, the level of the signal that should be output from the signal output terminal 40 exceeds the signal level that can be output from the signal output terminal 40, as determined by the supply voltages VL+ and VL−, so the output signal gets distorted by the measure of the supply voltages VL+ and VL−In a case like this, the hybrid IC device with a wide dynamic range 100 controls the npn power transistor 32 and the pnp power transistor 34 under output signals from the signal output terminal 40. By so doing, the overall circuit diagrammed in FIG. 8 operates with power from the supply voltages VH+ and VH−. As a result of this operation, the output signal from the signal output terminal 40 becomes a normal undistorted waveform, even when the absolute value of the voltage of the input signal exceeds a certain level.

When this embodiment is employed, as described above, a dual-power-supply switching amplifier circuit having wide dynamic range can be configured using the hybrid IC device with a wide dynamic range 100.

This embodiment has been described in terms of a configuration which uses the hybrid IC device with a wide dynamic range 100. By implementing a configuration which uses either of the hybrid IC devices with a wide dynamic range 101 or 102, however, a dual-power-supply switching amplifier circuit exhibiting wide dynamic range can be configured, and the present invention is not limited by the embodiment described above.

By employing the present invention, as described in the foregoing, a hybrid IC device with a wide dynamic range can be implemented by linking together a plurality of monolithic ICs by the interconnect method described in the foregoing.

What is claimed is:

1. A hybrid IC device having a wide dynamic range, configured by cascade-connecting at least two monolithic ICs, comprising:

a first monolithic IC; and a second monolithic IC for which an upper-limit potential within an operating range of the second monolithic IC is a potential that is higher by exactly a prescribed voltage than a potential on one electrode terminal provided in the first monolithic IC which has a lowest potential, wherein the prescribed potential is at least twice the voltage required between the base and emitter for transistors in said first monolithic IC and said second monolithic IC to operate normally.

2. The hybrid IC device with a wide dynamic range according to claim 1, wherein said first monolithic IC at least comprises:

a first transistor wherein the base electrode is connected to a first base electrode terminal and a current is supplied to a first supply electrode terminal;

a first constant current source that is connected to a positive highest potential electrode terminal and that supplies a constant current to a second current electrode terminal;

a first signal input terminal, the first signal input terminal being a positive signal input terminal of the hybrid IC device;

a first signal output terminal, the first signal output terminal being a positive signal output terminal of the hybrid IC device; and a first substrate electrode terminal, the first substrate electrode terminal exhibiting the lower-limit potential within the wide dynamic range of the hybrid IC device; and said second monolithic IC at least comprises:

a second constant current source that is connected to a first intake electrode terminal and that supplies a constant current to a negative highest potential electrode terminal and to a second substrate electrode terminal;

a second transistor wherein the base electrode is connected to a second base electrode terminal and which inputs current from a second intake electrode terminal having an upper-limit potential within the operating range of said second monolithic IC;

a bias electrode terminal;

a second signal input terminal, the second signal input terminal being a negative signal input terminal of the hybrid IC device; and a second signal output terminal, the second signal output terminal being a negative signal output terminal of the hybrid IC device, wherein said first supply electrode terminal and said first intake electrode terminal are connected, said second supply electrode terminal and said second intake electrode terminal are connected, said first base electrode terminal and said second base electrode terminal are connected, said first substrate electrode terminal and said bias electrode terminal are connected, potential on said bias electrode terminal is lower than potential on said second base electrode terminal, and voltage across said first supply electrode terminal and said second intake electrode terminal is at least twice the voltage across said base and emitter.

3. The hybrid IC device with a wide dynamic range according to claim 2, wherein said first transistor is an npn type and said second transistor is a pnp type; said first supply electrode terminal is connected to emitter electrode of said first transistor; and said second intake electrode terminal is connected to emitter electrode of said second transistor.

4. The hybrid IC device with a wide dynamic range according to claim 2, wherein said first transistor is a lowest-potential transistor and said second transistor is a highest-potential transistor.

5. The hybrid IC device with a wide dynamic range according to claim 1, wherein said two monolithic ICs have same characteristic dynamic range.

6. The hybrid IC device with a wide dynamic range according to claim 1, wherein said two monolithic ICs are each amplifier circuits which, as a whole, configure an amplifier circuit with wide dynamic range.

7. The hybrid IC device with a wide dynamic range according to claim 6, wherein said amplifier circuits are differential amplifier circuits.

8. The hybrid IC device with a wide dynamic range according to claim 1, wherein electrode terminals of said two monolithic ICs are each connected by using wire bonding.

* * * * *